United States Patent
Serdynski et al.

(10) Patent No.: US 9,646,738 B2
(45) Date of Patent: May 9, 2017

(54) SYSTEM FOR ISOLATING POWER CONDUCTORS USING FOLDED INSULATED SHEETS

(71) Applicant: Rockwell Automation Technologies, Inc., Mayfield, OH (US)

(72) Inventors: David P. Serdynski, Waukesha, WI (US); Dean T. Meyer, Oak Creek, WI (US); Cody J. Pumala, Cameron, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 14/971,022

(22) Filed: Dec. 16, 2015

(65) Prior Publication Data

US 2017/0098489 A1 Apr. 6, 2017

Related U.S. Application Data

(60) Provisional application No. 62/236,399, filed on Oct. 2, 2015.

(51) Int. Cl.
*H05K 5/04* (2006.01)
*H01B 3/44* (2006.01)
*H02G 3/04* (2006.01)

(52) U.S. Cl.
CPC .......... *H01B 3/441* (2013.01); *H02G 3/0437* (2013.01); *H05K 5/04* (2013.01)

(58) Field of Classification Search
USPC .............. 361/601, 605, 611, 637, 639, 648; 174/71 B
See application file for complete search history.

(56) References Cited

U.S. PATENT DOCUMENTS

| | | | | | |
|---|---|---|---|---|---|
| 3,924,161 | A | * | 12/1975 | Olashaw | H02B 1/21 174/138 F |
| 4,242,718 | A | * | 12/1980 | Shariff | H02B 1/21 174/70 B |
| 2005/0075808 | A1 | * | 4/2005 | Jensen | G01R 19/155 702/64 |
| 2007/0109733 | A1 | * | 5/2007 | Malkowski, Jr. | H02B 1/21 361/648 |
| 2007/0227754 | A1 | * | 10/2007 | McEvatt | H02B 1/06 174/5 R |
| 2010/0059276 | A1 | * | 3/2010 | Bhathija | H01R 25/145 174/99 B |
| 2010/0314166 | A1 | * | 12/2010 | Malkowski, Jr. | H02B 1/21 174/72 B |

* cited by examiner

*Primary Examiner* — Michael F McAllister
(74) *Attorney, Agent, or Firm* — Boyle Fredrickson, S.C.

(57) ABSTRACT

An improved electrical system may be provided by electrically isolating complex bus geometries by using one or more substantially flat and electrically insulating sheets. The sheet may have one or more fold lines which allow the sheet to fold in multiple directions and ways over varying configurations of power conductors. The sheet may fit within the constraints of preconfigured electrical system components without the need for redesigning such components. The sheet may have a dielectric strength per mil effective to isolate power conductors based on maximum charge and proximity of the power conductors.

20 Claims, 18 Drawing Sheets

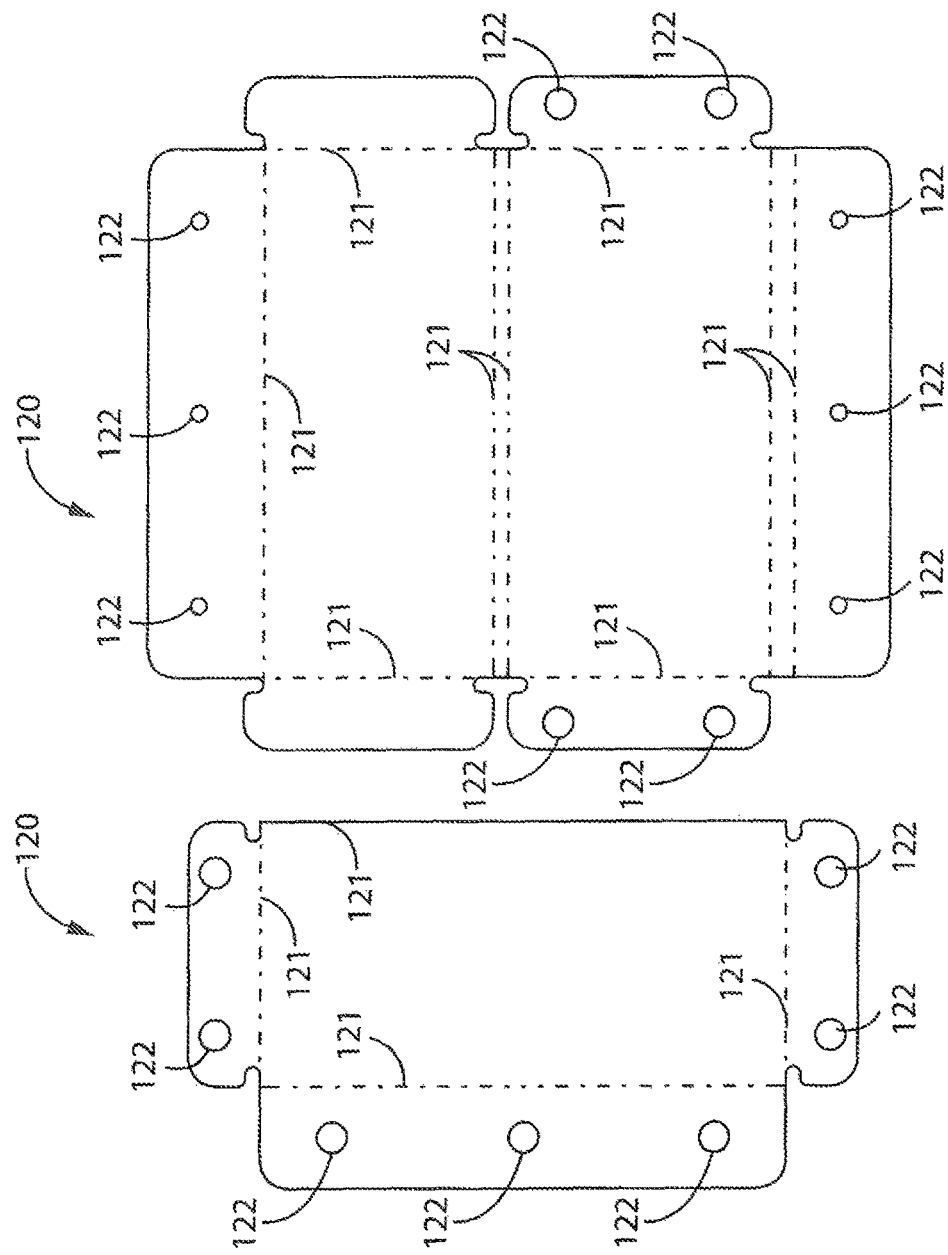

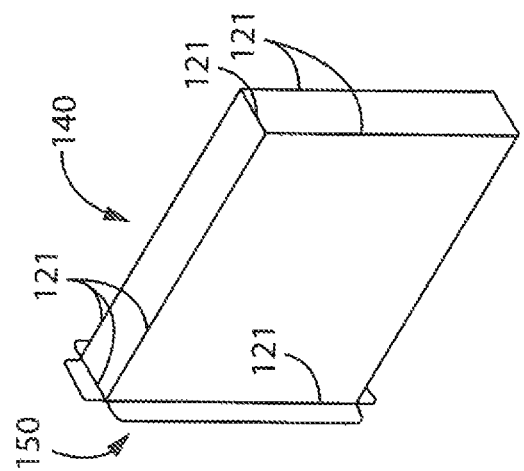
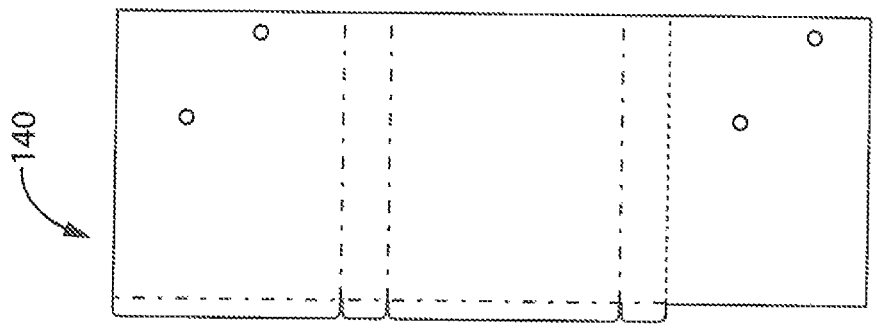

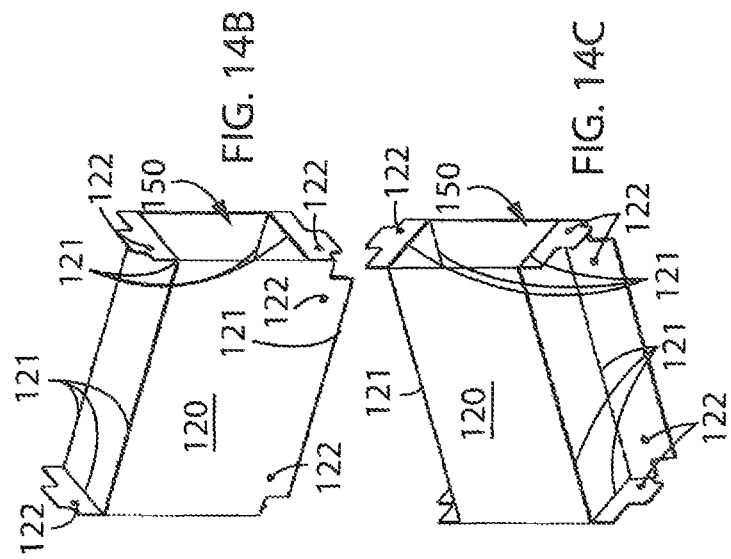
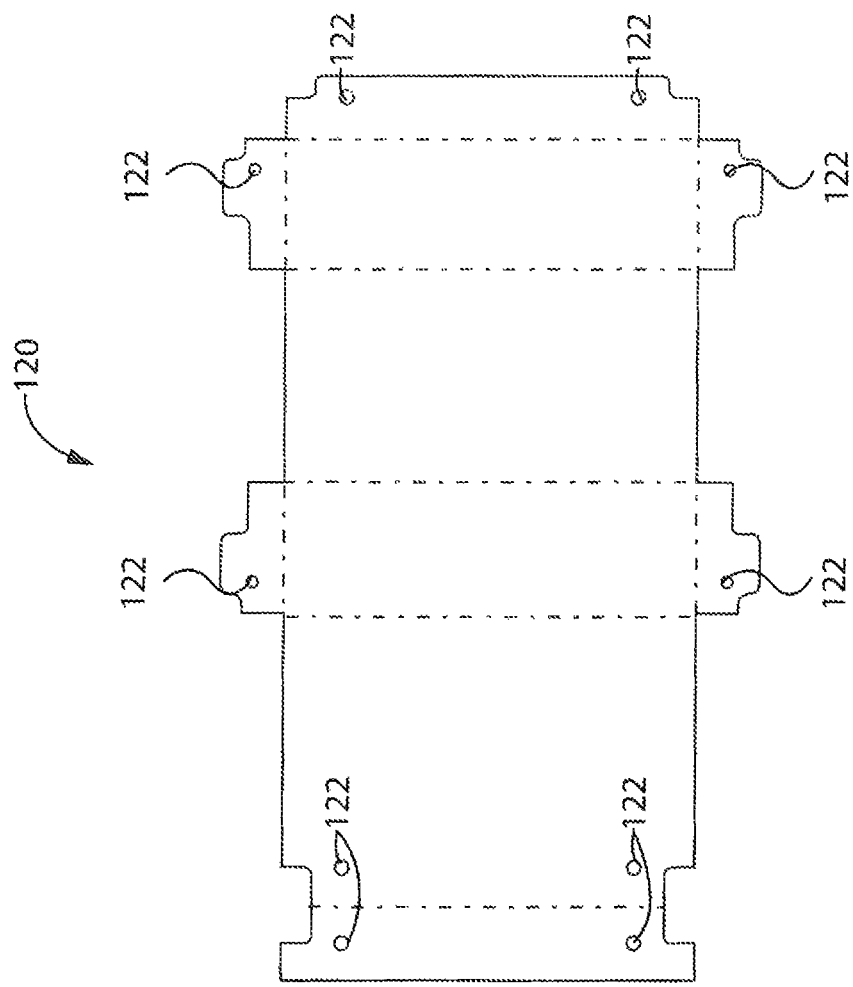

SYSTEM FOR ISOLATING POWER CONDUCTORS USING FOLDED INSULATED SHEETS

CROSS-REFERENCE TO RELATED APPLICATIONS

This application claims priority to U.S. Provisional Patent Application No. 62/236,399, entitled "System for Isolating Power Conductors Using Folded Insulated Sheets," filed on Oct. 2, 2015, which is herein incorporated by reference.

FIELD OF THE INVENTION

The present invention relates generally to electrical systems, such as for the distribution of power signals to controlled equipment, and more particularly, to electrical isolation in such systems.

BACKGROUND OF THE INVENTION

Electrical systems with packaged electrical and electronic components are known and are in use. For example. Motor Control Centers (MCC's) are used for power and data distribution in large and industrial operations. In MCC's, a variety of components, such as switchgear, semiconductor power electronic circuits, programmable logic controllers, motor controllers, and so forth, are housed in large electrical enclosures that may be subdivided into sections or columns, which may be further subdivided into compartments. The MCC includes associated bus bars, interconnections and supporting structures for distribution of electrical power to the various compartments.

Typically, the MCC is connected to a main power line that may feed three-phase AC power to horizontal bus bars of the MCC. The horizontal bus bars, in turn, may feed the three-phase power to vertical bus bars disposed in each of the sections or columns of the MCC. The vertical bus bars, in turn, may feed the three-phase power to various units (which typically include electrical components) that are installed in compartments of a section. The units, in turn, may provide power terminals (conductors), such as copper bus bars, for feeding the three-phase power to a system environment, such as motors, as may be required for various applications.

However, in order to meet minimum electrical short-circuit protections, such as in accordance with International Electrotechnical Commission (IEC) and/or Underwriters Laboratories (UL) standards, power conductors should be sufficiently insulated and/or mounted with adequate distance from other conductive parts (including neighboring power conductors). Accomplishing this within the access and/or dimension constraints of the MCC and/or constituent components of the MCC is particularly challenging. A need therefore exists to provide minimum electrical short-circuit protections within such access and/or dimension constraints.

SUMMARY OF THE INVENTION

The present inventors have recognized that an improved electrical system may be provided by electrically isolating complex bus geometries by using one or more substantially flat and electrically insulating sheets. The sheet may have one or more fold lines which allow the sheet to fold in multiple directions and ways over varying configurations of power conductors. The sheet may fit within the constraints of preconfigured electrical system components without the need for redesigning such components. The sheet may have a dielectric strength per mil effective to isolate power conductors based on maximum charge and proximity of the power conductors.

Accordingly, exposed power conductors in electrical systems may be electrically isolated from one another. As a result, an improved electrical system may be provided that is less susceptible to "arc flash" (a phenomena in which a luminous discharge of current is formed when a current jumps a gap, through air or gas, in a circuit or between two conductors) and/or other hazards.

Electrically insulating sheets (or folded boots) may also contain openings or apertures allowing the sheets to be connected to various areas, such as to structural mountings in electrical system, to other sheets, and/or to the sheet itself. Such connections may be made, for example, by way of clips, such as nylon arrow clips, push-in fasteners or canoe clips. Alternatively, such connections may be made by way of tabs designed into the sheet itself which may be positively retained by openings or passages in various areas (which may also be designed into the sheet itself).

Aspects of the invention may allow for the insulation of complex bus geometries without the need for redesigning existing electrical systems or components. The invention may be part of a system for insulating buses, such as in compliance with the international Electrotechnical Commission (IEC) 61641:2014 guide for testing under conditions of arcing due to internal fault. Accordingly, boots may be created from electrically insulating sheets, such as polypropylene sheets, instead of requiring epoxy, injection molding, shrink tubing and/or taping.

The invention allows for the convenient design a variety of two-dimensional patterns for boots based on custom configurations. Such boots may then be available with far greater speed than epoxy and/or molded alternatives. Accordingly, boots may be easily and intuitively designed and installed in the field.

Aspects of the invention may utilize thin sheet material commercially available today which has the ability to be die cut into two dimensional shapes. Typical material for the sheets may be polypropylene based, but other materials having a dielectric strength per mil effective to isolate power conductors could be employed as well. Once cut to shape, the sheets can be folded at crease lines to allow them to wrap and insulate bus components and connection points that might ordinarily be done with an injection molded boot. Folded boots are a more cost effective, shorter lead time solution. Sheets may fold into three dimensional volumes for insulating, and may be joined with other sheets, such as by using thermal bonding (such as via heat stake, hot plate, ultrasonic, and the like), thereby allowing even more complex parts to be formed from the two dimensional shapes via addition of a second process after folding.

Accordingly, the folded boots or sheets eliminate the need, for example, of factories to hand cut shrink tubing to length, slide over bus a bar, heat with heat guns or a paint oven, trim to final length, and cut openings for fasteners and bolted connections on bus a bar if required. Moreover, the folded boots or sheets eliminate the need to modify insulated bus support tooling.

The electrically insulating sheet may be manufactured from polypropylene, and/or may be black in color to maximize radiant cooling.

Specifically then, one aspect of the present invention provides a system for isolating power conductors including: a bus support; first and second power conductors disposed proximal to one another along the bus support; and a substantially flat, electrically insulating sheet having at least one fold line. The at least one fold line may allow the sheet to fold over at least one of the first and second power conductors in at least two directions. The electrically insulating sheet may electrically isolate a portion of the first power conductor from the second power conductor.

These and other features and advantages of the invention will become apparent to those skilled in the art from the following detailed description and the accompanying drawings. It should be understood, however, that the detailed description and specific examples, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

FIGS. 12A and 12B is are plan views of alternative electrically insulating sheets, each in accordance with an aspect of the invention;

FIG. 13A is a plan view of an alternative electrically insulating sheet, and FIG. 13B is an isometric view of the electrically insulating sheet of FIG. 13A, in accordance with an aspect of the invention;

FIG. 14A is a plan view of an alternative electrically insulating sheet, and FIGS. 14B and 14C are isometric views of the electrically insulating sheet of FIG. 14A, in accordance with an aspect of the invention;

DETAILED DESCRIPTION

Figure 1:
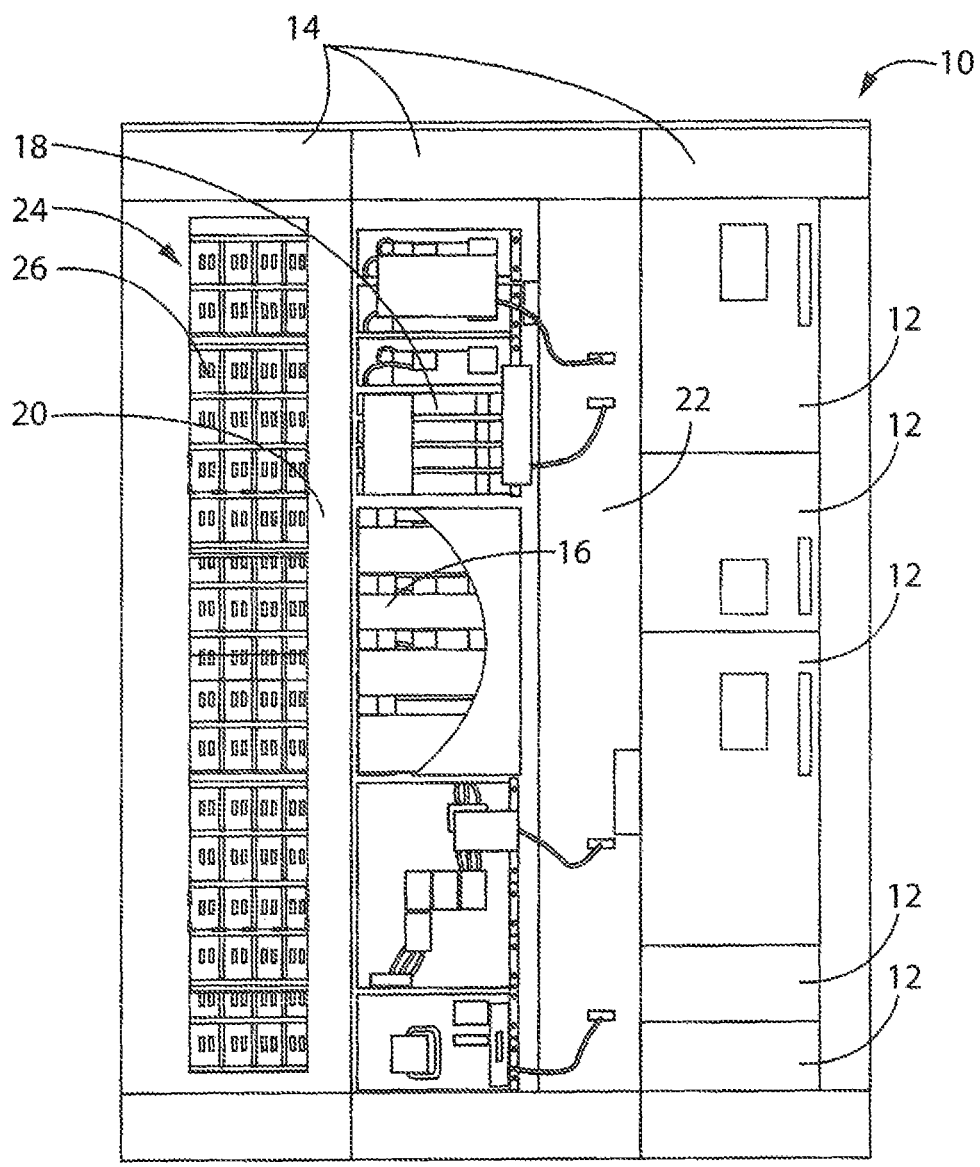
FIG. 1 is an exemplary electrical system in which electrical units of various types may be housed in accordance with an aspect of the invention.

Referring now to FIG. 1, an exemplar electrical system 10 is provided in which electrical units 12 of various types may be housed. The electrical system 10 may be, for example, a Motor Control Center ("MCC") or other industrial, commercial, marine, or other electrical system. In general, the electrical system 10 may provide one or more sections 14, each forming a shell around a device mounting volume for supporting the units 12. The shell may be made of any suitable material, such as heavy gage sheet metal, reinforced plastics, and so forth. The electrical system 10 may typically receive three-phase power from an external power supply, such as a power supply grid, and/or data signals, via appropriate conduits (not shown), and distribute the received power and/or data signals to one or more of the sections 14 in various manners. The sections 14 may be electrically isolated from one another, or alternatively, may be electrically joined with other sections 14, such as via common horizontal power buses 16.

The units 12 may each include a door for covering an assembly of components 18 that are supported within each unit 12 via known methods, such as screwed or snap-in engagement, thereby providing mechanical and electrical connection to the electrical system 10. Exemplary components 18 of the units 12 may include relays, motor starters, and Programmable Logic Controllers ("PLC's"), among others. Doors for the units 12 may include, for example, a lever for opening the door, a lock for preventing the door from opening, and/or light for indicating a safe condition for opening the door. A latch rail (not shown) may be provided in each section 14 to interface with latches on the individual doors of the units 12.

The sections 14 may also include wire-ways 20 in which line and load wiring, cabling and so forth may be installed to service the components 18. The sections 14 may optionally include preconfigured isolation areas 22 for variations in which greater electrical isolation between sections 14 is desired.

Along a rear wall of each of the sections 14 may be disposed a vertical bus system 24 configured to facilitate distribution of power throughout a corresponding section 14, such as in a plug-in manner. The bus system 24 may be generally formed as a backplane having slots 26 for receiving conventional stab-type electrical connections on rear surfaces of device supports received within a section 14. Such slot and stab arrangements are generally known in the art. As illustrated, the slots 26 may be divided into pairs to receive a corresponding two-pronged stab for each phase of electrical power. Rows of such slots 26 may be provided to allow device supports to be mounted at various levels within a section 14.

Figure 2:
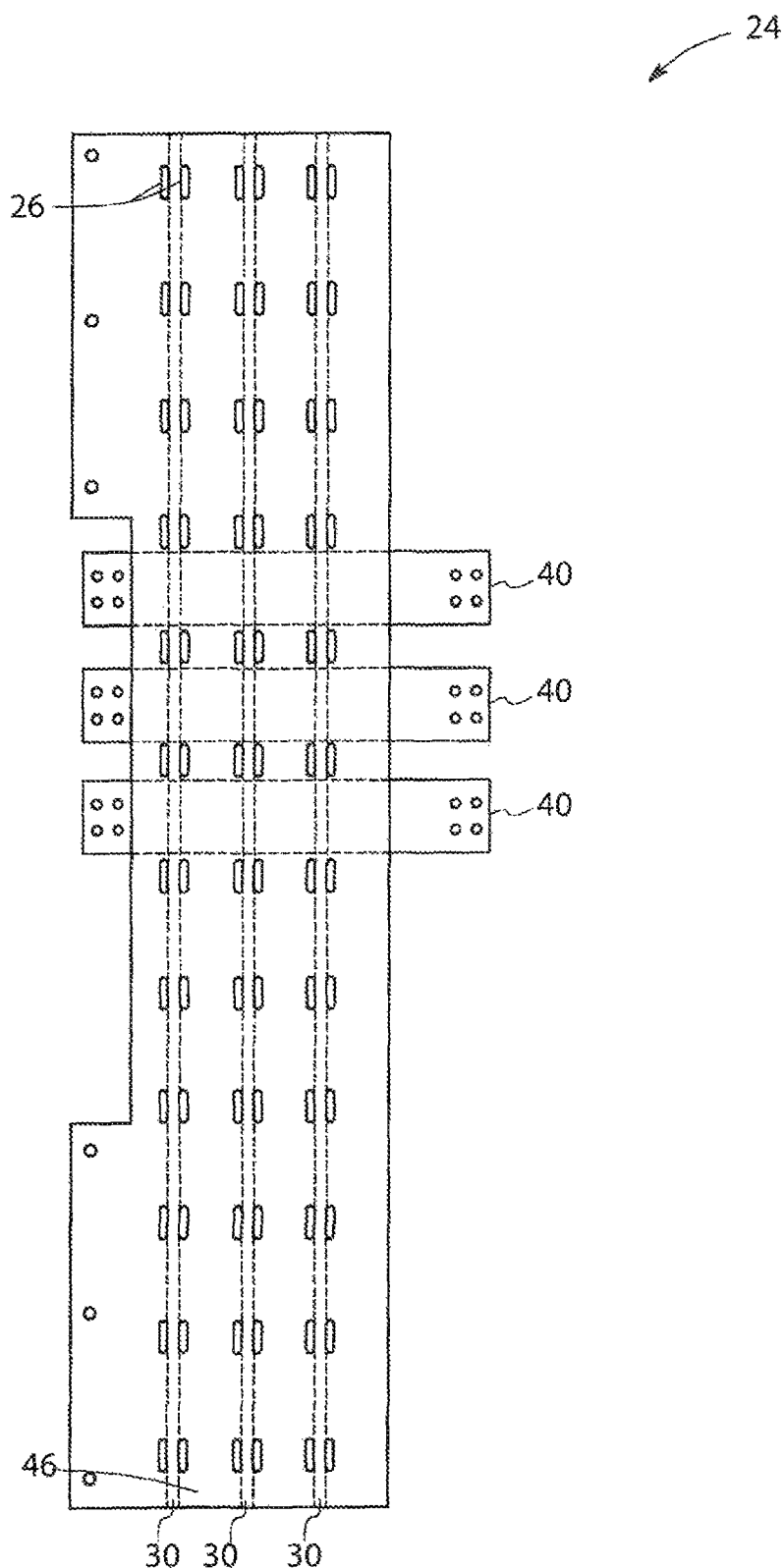
FIG. 2 is an exemplary bus system which may be included within a section of the electrical system of FIG. 1 in accordance with an aspect of the invention.

Referring now to FIG. 2, an exemplary configuration of the bus system 24 of FIG. 1 is provided. The bus system 24 may include multiple power busses disposed within a section 14. In the illustrated embodiment, the bus system 24 includes first, second and third vertical bus conductors 30 disposed proximal to one another, which may correspond to differing phases of a three-phase power system (power conductors). Further, the bus system 24 includes first, second and third horizontal bus conductors 40 disposed proximal to one another, which may also correspond to the differing phases of the three-phase power system (power conductors), but in a different direction.

In certain embodiments, the horizontal bus conductors 40 could be coupled to cabling that supplies three-phase power from an external power supply, such as a power supply grid, and the first, second and third horizontal bus conductors 40 could be coupled to the first, second and third vertical bus conductors 30. Also, in certain embodiments, the horizontal bus conductors 40 of one section could be coupled (or "spliced") with the horizontal bus conductors 40 of another (flanking) section. In alternative embodiments, more horizontal and/or vertical bus conductors could be provided, such as for providing a neutral conductor, protective earth, ground or additional power phase, or fewer horizontal and/or vertical bus conductors could be provided, as appropriate for the environment.

The bus system 24 may include a bus cover 46 and a rear bus support that will be described in greater detail below. In the illustrated embodiment, the bus cover 46 may include a molded sheet of synthetic material disposed over the vertical and horizontal bus conductors and may serve to prevent contact with underlying power busses except through the slots 26. The vertical bus conductors 30 are typically made of a bar stock or tubing stock with a flat area that permits them to be mechanically and electrically coupled to corresponding horizontal bus conductors 40 in the bus system 24.

Connection of component supports (such as mounted on plates or drawers, not shown) may be made by two pronged stabs that are received through the slots 26 and engage the individual bus bars behind the bus cover 46. As described above, the bus system 24 further includes a bus support configured to support the vertical and horizontal bus conductors that is described in detail below with reference to FIG. 3.

Figure 3:
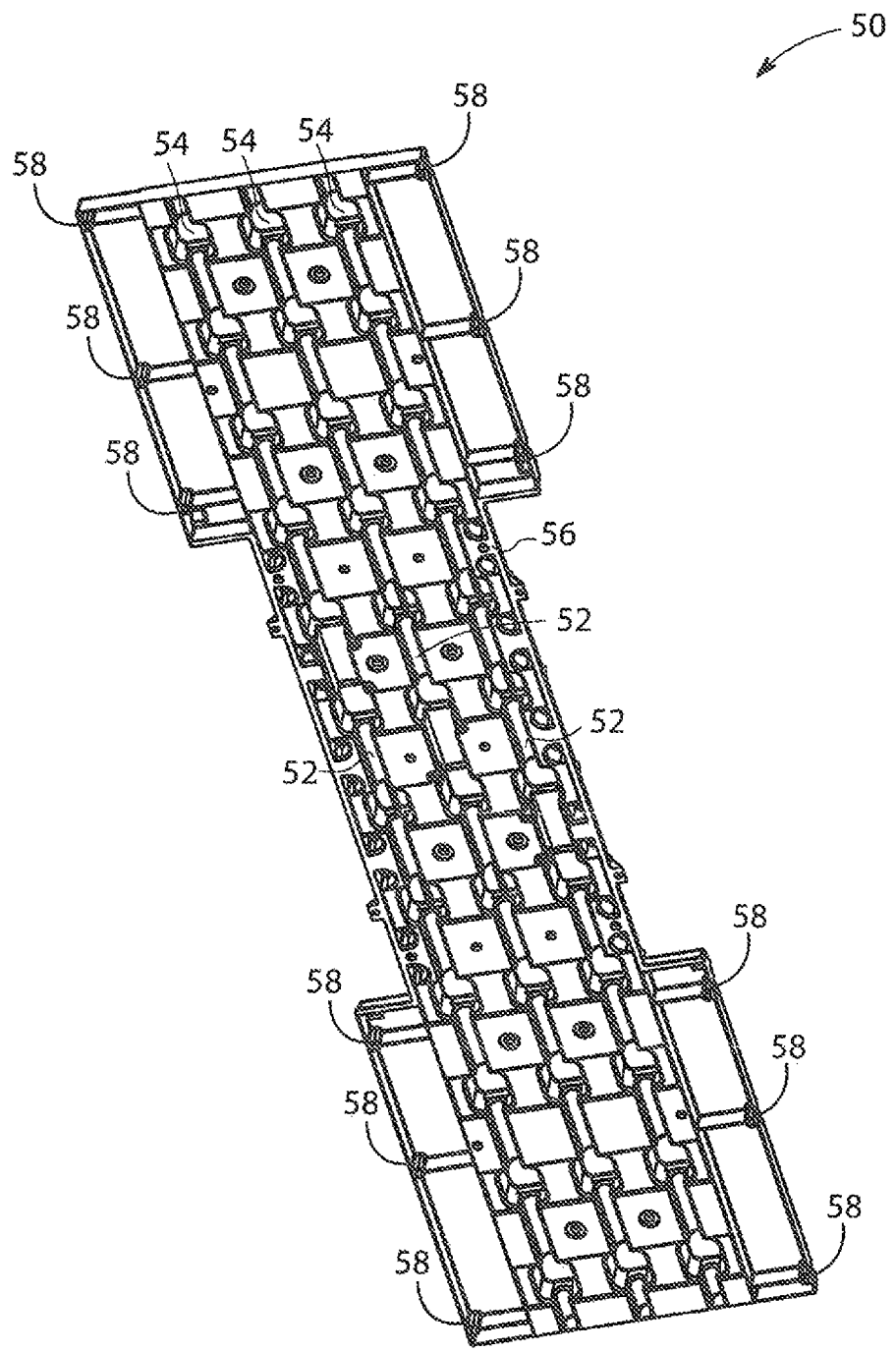
FIG. 3 is an exemplary preconfigured isolated bus support which may support power busses of the bus system of FIG. 2 in accordance with an aspect of the invention.

Referring now to FIG. 3, an exemplary preconfigured isolated bus support 50 is illustrated for supporting the power busses of the bus system 24 of FIG. 2. As illustrated, the bus support 50 may be a molding with vertical channels 52 to receive the vertical bus conductors 30 of FIG. 2. Each of the vertical channels 52 may include rear protrusions 54 on a rear side 56 of the bus support 50. In the illustrated embodiment, the bus support 50 mechanically supports the various horizontal and vertical bus conductors. Within the bus system 24, and generally between the bus support 50 and the bus cover 46 (see FIG. 2), each vertical bus conductor may generally include a connection portion that is engaged by stabs of component supports and a bus anchoring portion.

Accordingly, the horizontal bus conductors 40 (see FIG. 2) may be generally supported on a rear surface of the bus support 50, while the vertical bus conductors 40 (see FIG. 2) may be supported on a front surface thereof. In the illustrated embodiment, the bus support 50 includes a series of apertures 58 or holes for receiving mounting bolts or screws. These apertures 58 will generally be aligned with corresponding apertures in rear of the electrical system 10 to support the bus system 24 when mounted therein. The vertical bus conductors 30 may be received within corresponding recesses of the vertical channels 52. The recesses may generally be semicircular grooves in which the vertical bus conductors 30 may lie.

Opposing the rear protrusions 54, which may be somewhat deeper than the recesses, are pockets designed to receive and accommodate stabs (not shown) of component supports that will protrude through the slots 26 in the bus cover 46. Furthermore, the bus support 50 may include a series of apertures (not shown) that extend completely through the bus support 50 for mechanical and electrical connection to the horizontal bus conductors 40.

In the illustrated embodiment, the bus support 50 may be formed as a single piece of molded plastic material. The material is preferably one that will not degrade or melt with elevated temperatures that may occur during normal operation. In certain embodiments, the bus support 50 may comprise glass filled polyester, a thermoset plastic. The bus support 50 could also include add-on bus support braces (not shown) disposed on the rear side of the bus support which may be configured to contact the channels to limit movement of the vertical bus conductors during a high current event.

Figure 4:
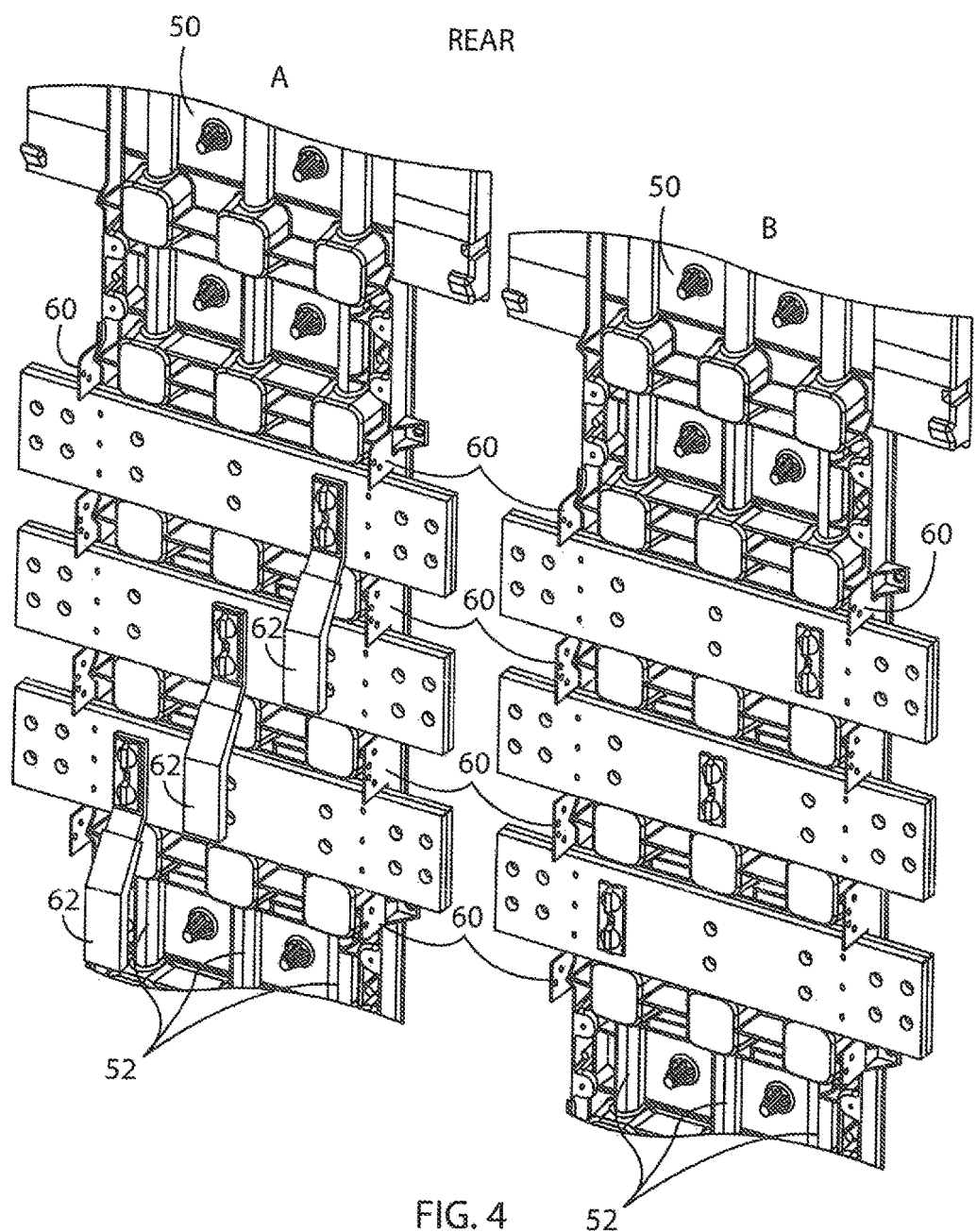
FIG. 4 is a rear view of flanking bus supports, each with horizontal bus conductors disposed thereon in accordance with an aspect of the invention.
Figure 11:
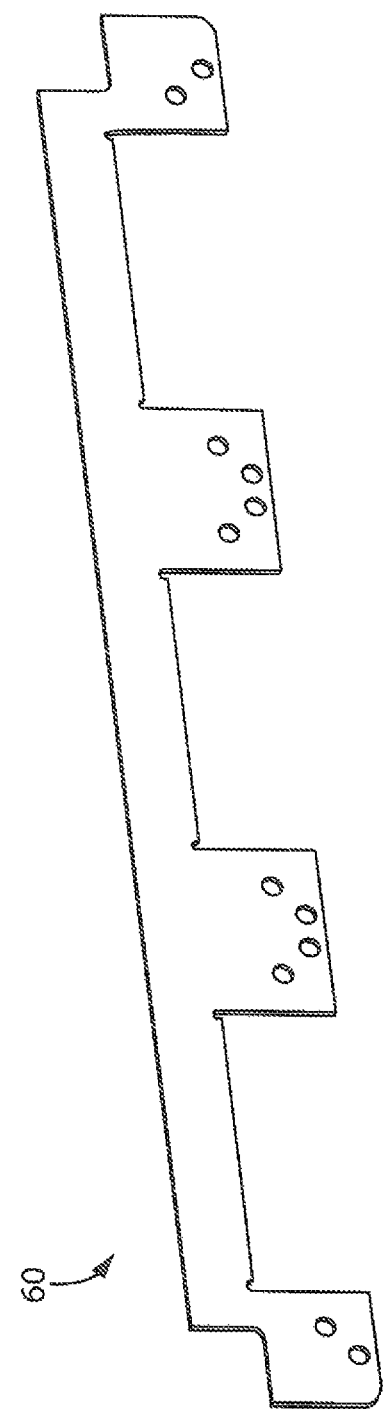
FIG. 11 is a vertical insulating barrier in accordance with an aspect of the invention.

Referring now to FIG. 4, a rear view of flanking bus supports 50 (identified as bus supports "A" and "B"), each with horizontal bus conductors 40 disposed thereon, is provided. Bus supports A and B may be provided, for example, in flanking sections 14 in the electrical system 10. In the configuration as shown, the horizontal bus conductors 40 of bus support A are disconnected and electrically separate from the horizontal bus conductors 40 of bus support B. A vertical insulating barrier 60 (see also FIG. 11) may be provided on each of the edges of the bus supports A and B, the vertical insulating barrier 60 being contoured around the horizontal bus conductors 40 to provide electrical isolation and protection in gaps between the horizontal bus conductors 40. In addition, a flexi-bar 62 or insulated cables may be fastened to each horizontal bus conductor 40 to provide a respective electrical power phase to the horizontal bus conductor 40 from the external power supply received by the electrical system 10.

Figure 5:
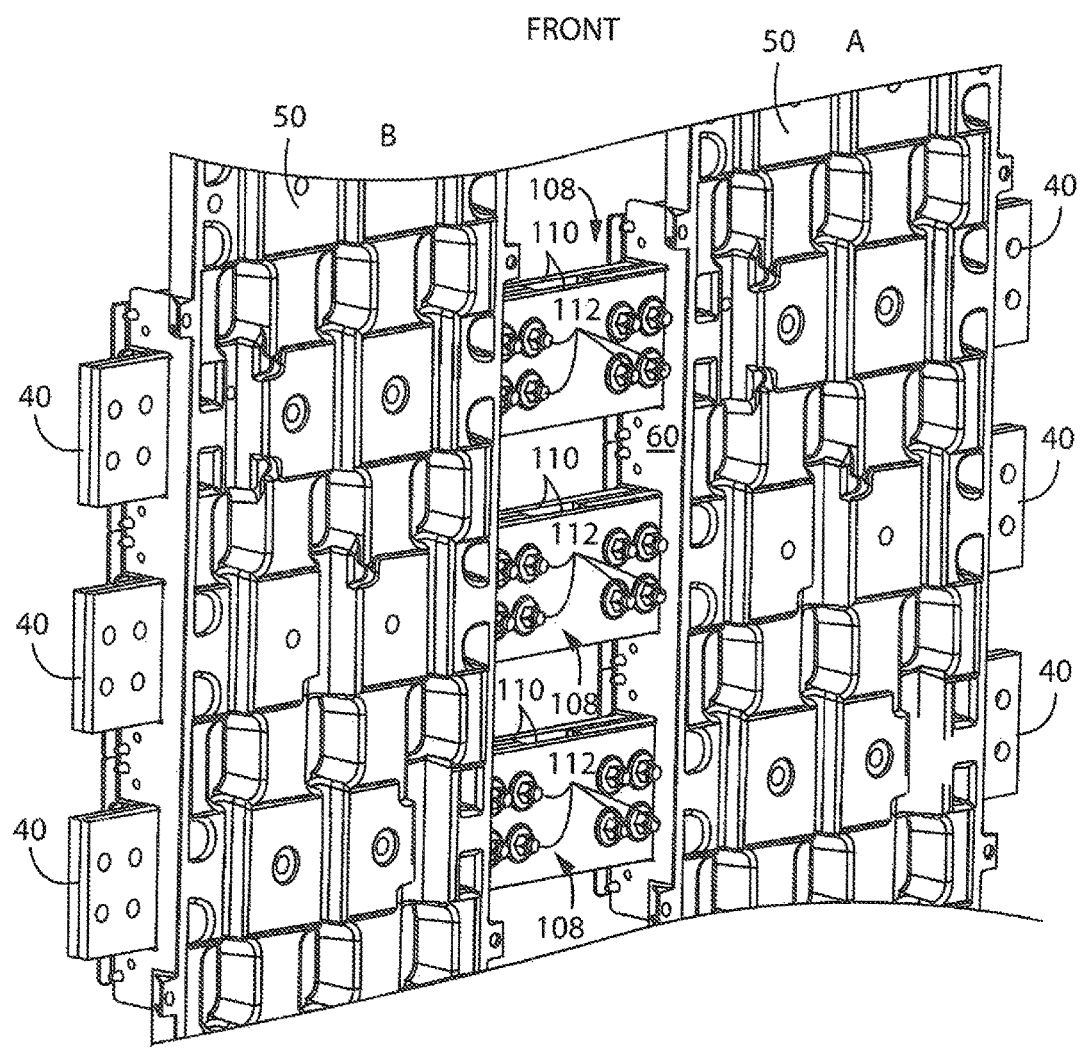
FIG. 5 is a front view of the flanking bus supports of FIG. 4 with electrically connected splice areas in accordance with an aspect of the invention.

Referring now to FIG. 5, a front view of the flanking bus supports A and B of FIG. 4 is provided in which the horizontal bus conductors 40 of bus support A may be electrically connected to (or "spliced" with) the horizontal bus conductors 40 of bus support B to form splice areas 108. This may be accomplished by attaching an electrically conducting splice plate 110 between the horizontal bus conductors 40 of bus support A and the horizontal bus conductors 40 of bus support B. The splice plate 110 may be attached to the horizontal bus conductors 40 using bus clamps 112 with opposing nuts and washers. A single splice plate 110 may be used to connect neighboring horizontal bus conductors 40 with lower current ratings, such as 600-1200 Amps. Alternatively, multiple splice plates 110 (such as front and back) may be used to connect neighboring horizontal bus conductors 40 with higher current ratings, such as 1600-3000 Amps.

Figure 6:
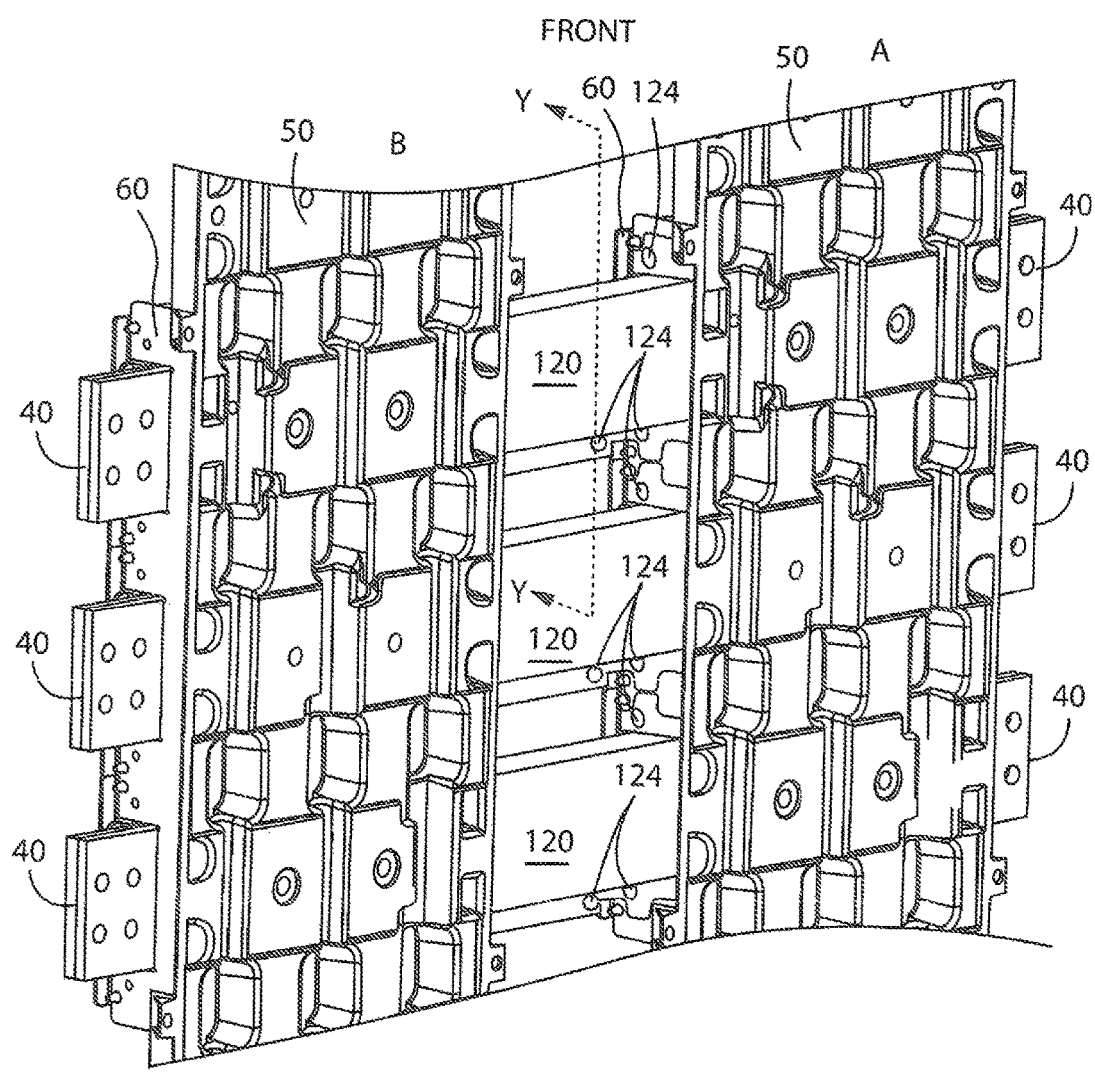
FIG. 6 is a front view of the flanking bus supports of FIG. 4 with electrically connected splice areas covered by substantially flat, electrically insulating sheets in accordance with an aspect of the invention.

Referring now to FIG. 6, the front view of the flanking bus supports A and B with electrically connected splice areas 108 of FIG. 4 is provided, now with the splice areas 108 each covered by substantially flat, electrically insulating sheets 120 (folded boots). Each electrically insulating sheet 120 has fold lines 121 allowing the sheet to fold over particular splice areas 108 (with respect to other splice areas 108 or other live fasteners or elements) in at least two directions, within the constraints of the bus support 50 molding and positioning of the electrical system 10. The fold lines 121 essentially allow the electrically insulating sheet to fold in multiple directions over a power conductor, thereby forming fold areas in multiple planes. Accordingly, the electrically insulating sheet 120 may wrap around a portion of, or all of, a splice area 108, including between the bus support 50 and a rear wall of the electrical system 10, with a dielectric strength per mil effective to isolate power conductors based on maximum charge and proximity of the power conductors. As a result, the electrically insulating sheets serve to electrically isolate the horizontal bus conductors 40 from one another (or from other live fasteners or elements) in the splice areas 108.

The electrically insulating sheets 120 may be manufactured from an electrically insulating material, such as polypropylene. The electrically insulating sheets 120 may also be black in color to maximize radiant cooling.

Figure 7:
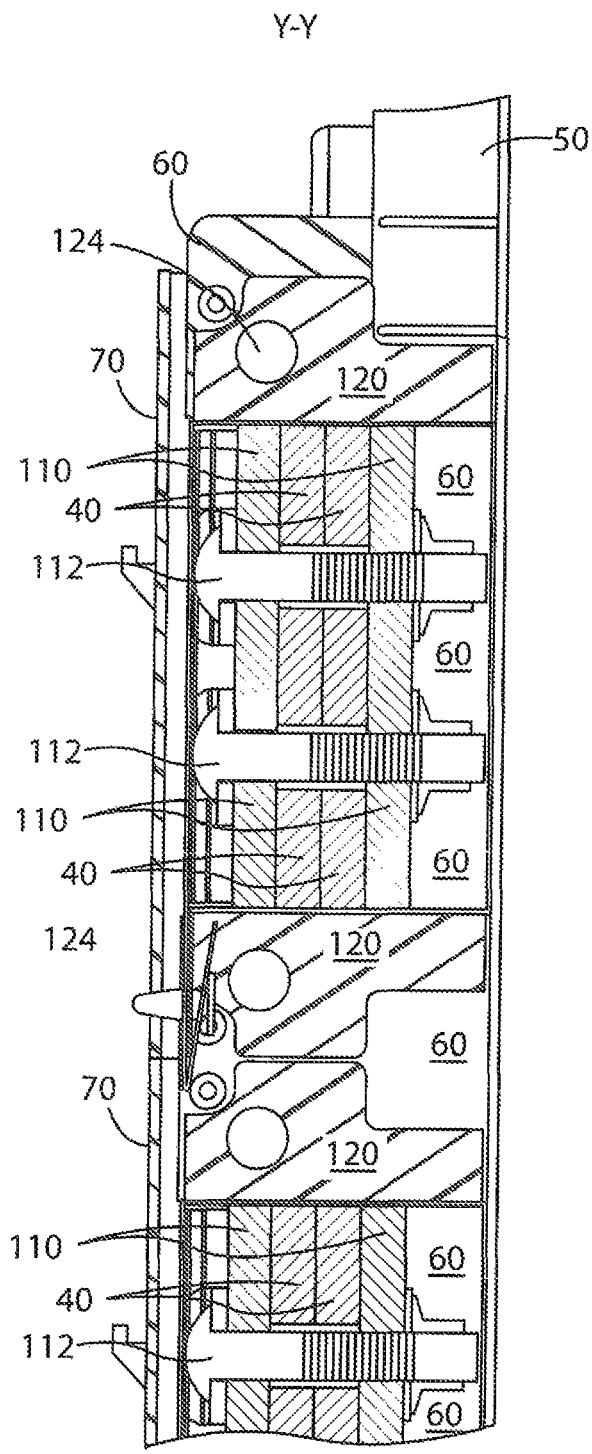
FIG. 7 is a cross sectional view of FIG. 6 taken along the plane Y-Y in accordance with an aspect of the invention.

The electrically insulating sheets 120 may also include apertures 122 or holes for receiving clips (such as canoe clips), plastic rivets, screws or other fasteners 124 for mounting in the electrical system 10, such as mounting back to itself upon wrapping around, mounting to the vertical insulating barrier 60, mounting to the bus support 50, or mounting to other areas. As may be readily apparent in FIG. 7, a cross sectional view taken along the plane Y-Y of FIG. 6, the electrically insulating sheets 120 may connect to various elements for secure attachment, including electrically insulating molded assemblies 70 configured to cover particular horizontal bus conductors 40 with respect to other horizontal bus conductors 40 or other live fasteners, the vertical insulating barrier 60, and/or back to itself, via the apertures 122 and fasteners 124.

Figure 8B:
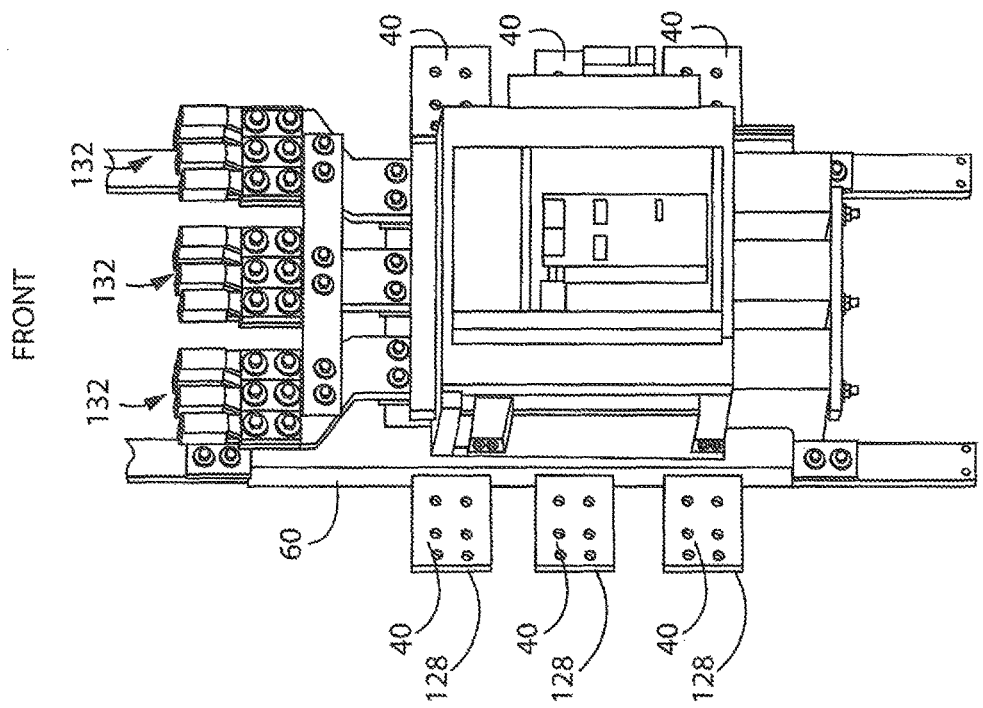
FIG. 8B is a front view of the bus system of FIG. 8A, each in accordance with an aspect of the invention.
Figure 8A:
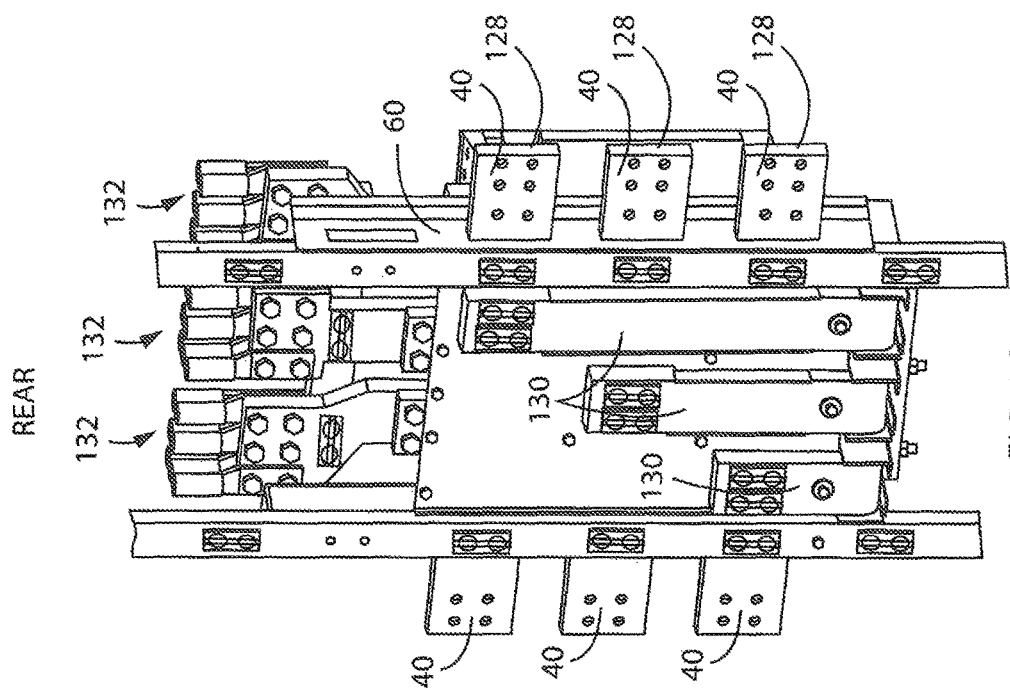
FIG. 8A is a rear view of another aspect of a bus system for the electrical system of FIG. 1.

Referring now to FIGS. 8A and 8B, rear and front views, respectively, are provided of another aspect of the bus system 26 for the electrical system 12 having live power conductors. In this aspect, horizontal bus conductor ends 128 of the horizontal bus conductors 40 are left disconnected or electrically separate (floating) from horizontal bus conductors 40 of a neighboring section 14. Also, power bus risers 130 are fastened to respective horizontal bus conductors 40 to provide corresponding electrical power phase connections to the horizontal bus conductors 40 from the external power supply received by the electrical system 10. Also, incoming lug pads 132 are fastened at top portion of the electrical system 10 which may also include electrical power supply of various phases. Consequently, various live power conductors may be left exposed in the system.

Figure 9B:
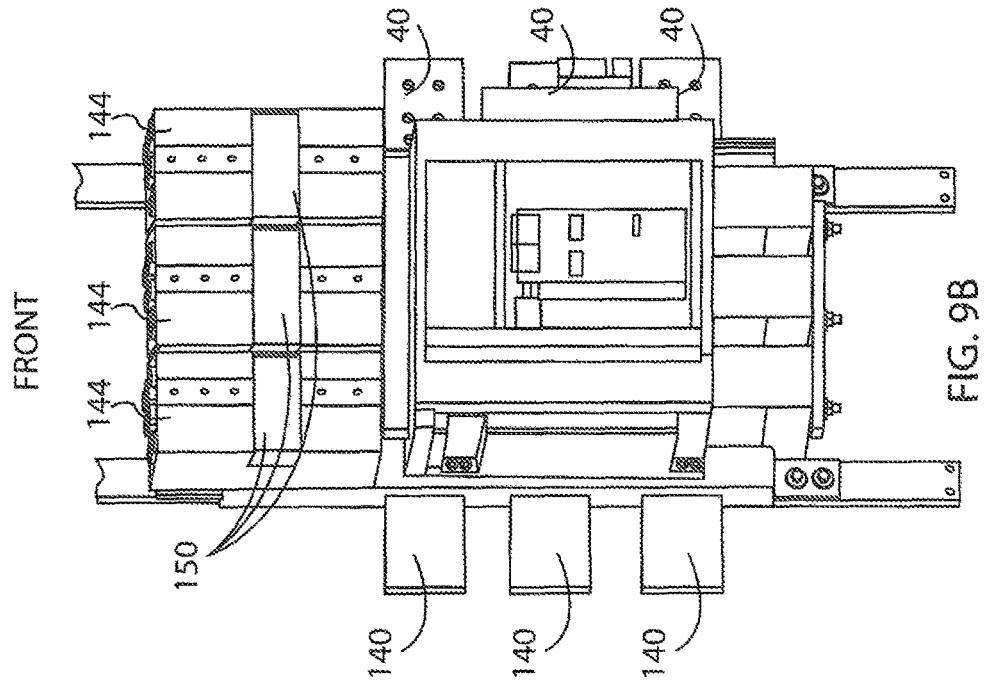
FIG. 9B is a front view of the bus system of FIG. 9A, each in accordance with an aspect of the invention.
Figure 9A:
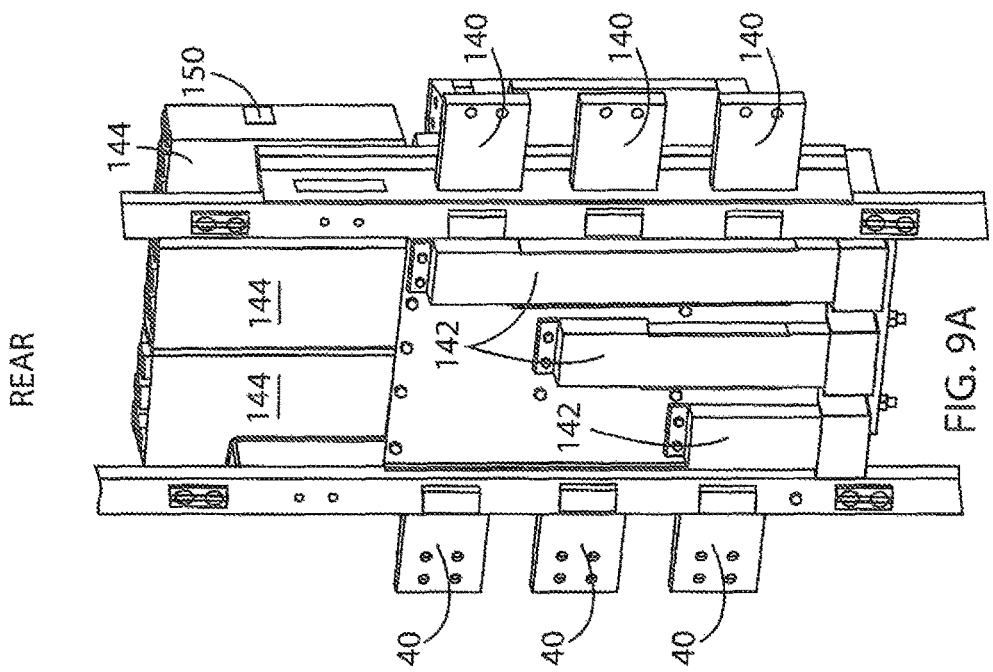
FIG. 9A is a rear view of the bus system of FIG. 8A in which various configurations of electrically insulating sheets are folded over various live power conductors.
Figure 10A:
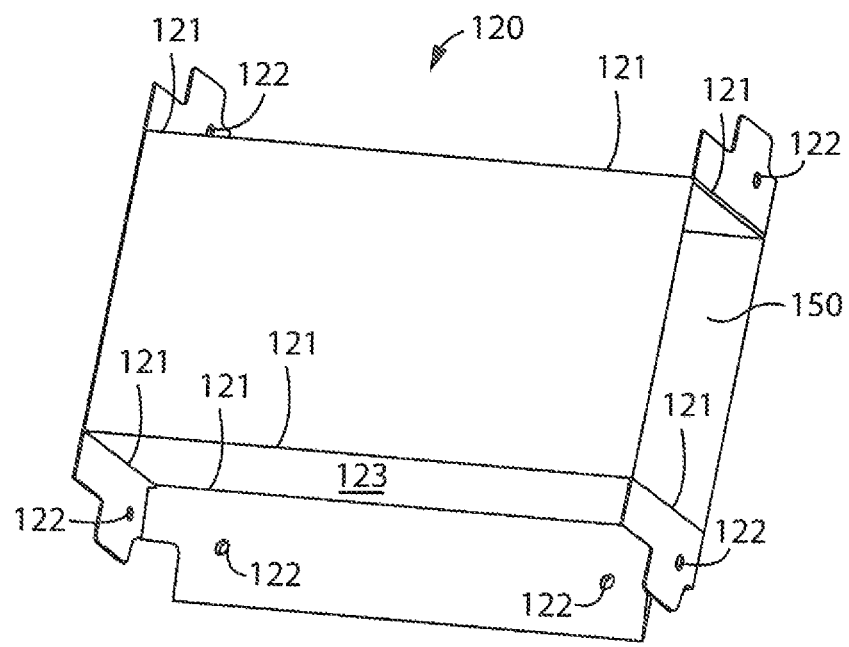
FIGS. 10A and 10B are isometric views of electrically insulating sheet in accordance with an aspect of the invention.
Figure 10B:
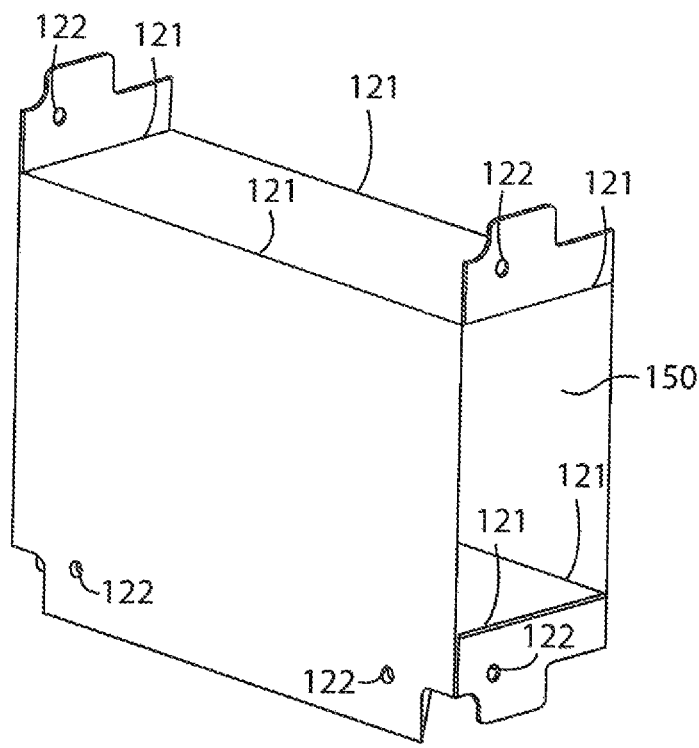

Referring now to FIGS. 9A and 9B, rear and front views, respectively, are provided in which various configurations of electrically insulating sheets 120 are folded over the various live power conductors shown in FIGS. 8A and 8B. In particular, electrically insulating sheets 140 are folded in multiple directions around the horizontal bus conductor ends 128, shown on one side, to electrically insulate the horizontal bus conductor ends 128 from other live elements in the system. Also, electrically insulating sheets 142 are folded in multiple directions around the power bus risers 130 to electrically insulate the power bus risers 130 from other live elements in the system. Also, electrically insulating sheets 144 are folded in multiple directions around the incoming lug pads 132 to electrically insulate the incoming lug pads 132 from other live elements in the system.

Figure 15B:
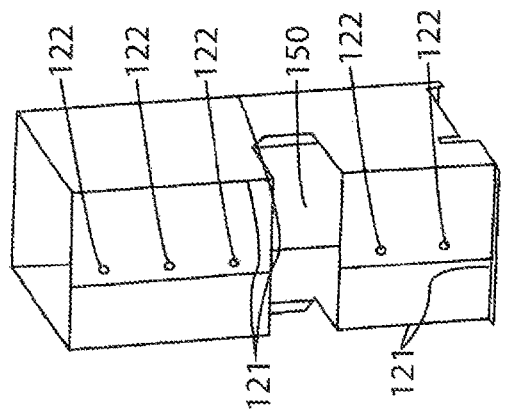
FIG. 15B is an isometric view of the electrically insulating sheet of FIG. 15A, in accordance with an aspect of the invention.
Figure 15A:
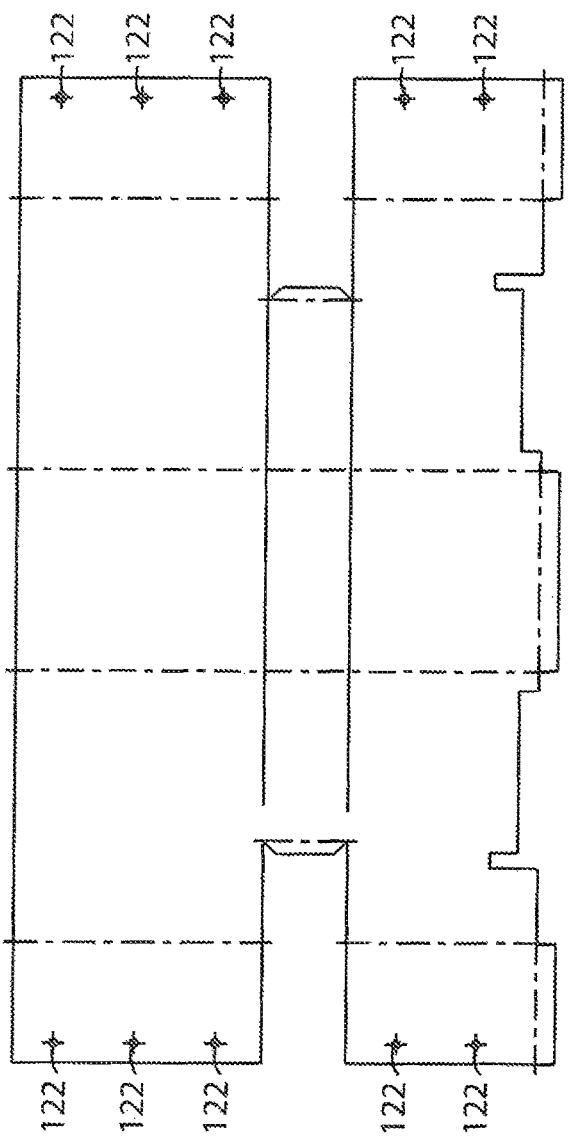
FIG. 15A is a plan view of an alternative electrically insulating sheet.
Figure 16:
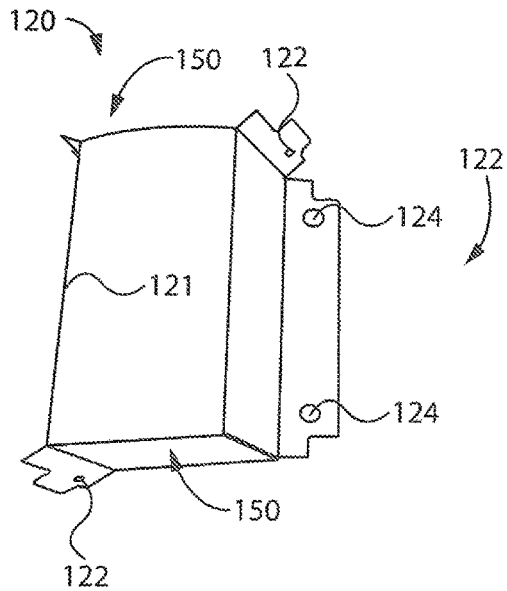
FIGS. 16, 17, 18 and 19 are isometric views of alternative electrically insulating sheet, each in accordance with an aspect of the invention.
Figure 17:
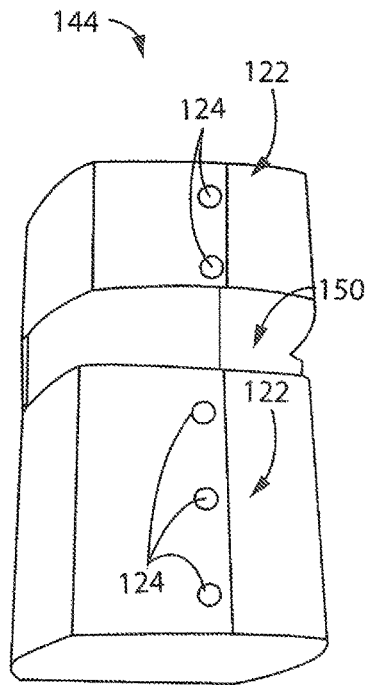
Figure 18:
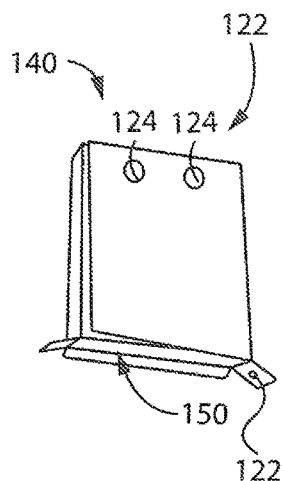
Figure 19:
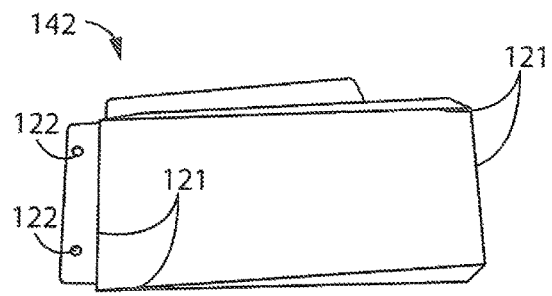
Figure 20:
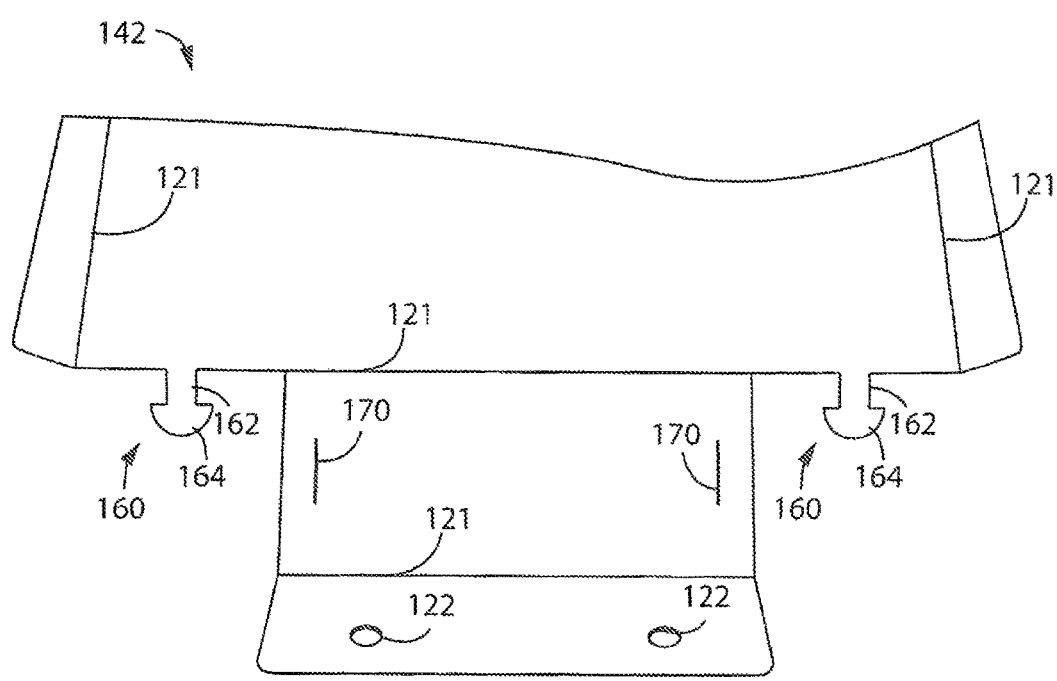
FIG. 20 is a partial view of an alternative electrically insulating sheet in which tabs and opposing tab openings may be provided.
Figure 21:
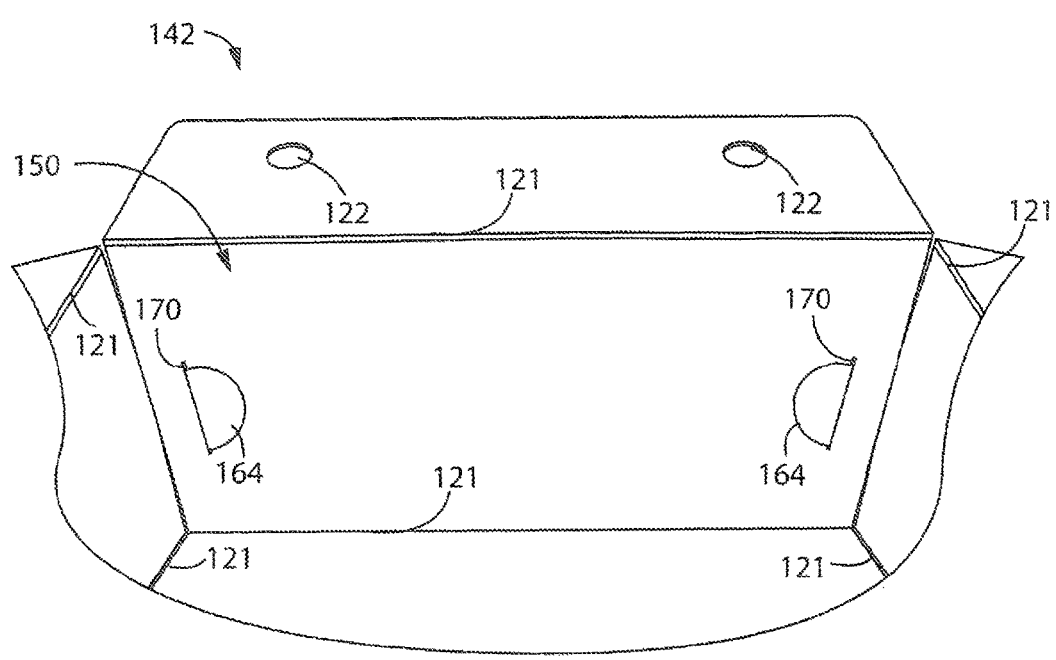
FIG. 21 is the electrically insulating sheet of FIG. 20 in which the tabs are positively retained by the opposing tab openings.

Each of the electrically insulating sheets may also provide one or more open areas 150 for allowing a covered power conductor to electrically connect and function in the system as may be required. For example, referring also to FIGS. 13A, 13B and 18, the electrically insulating sheet 140 of FIGS. 9A and 9B may form an open area 150 on one side in order to allow a horizontal bus conductor end 128 to enter into the electrically insulating sheet 140. Referring also to FIGS. 19-21, the electrically insulating sheet 142 of FIGS. 9A and 9B may form an open area 150 on one side (different from the electrically insulating sheet 140) in order to allow a power bus riser 130 to enter into the electrically insulating sheet 142. Referring also to FIGS. 15A, 15B and 17, the electrically insulating sheet 144 of FIGS. 9A and 9B may form an open area 150 on one side (different from the electrically insulating sheet 140 and the electrically insulating sheet 142) in order to allow incoming lug pads 132 to enter into the electrically insulating sheet 144.

Similarly, referring also to FIGS. 7, 10A, 10B, 12A, 12B, 14A, 14B, 14C and 16, the electrically insulating sheet 120 of FIG. 5 may form two open areas 150 on opposing sides (different from the electrically insulating sheet 140, the electrically insulating sheet 142, and the electrically insulating sheet 142) in order to isolate the horizontal bus conductors 40 from neighboring sections 14 to come together in a splice area 108. It will be appreciated that electrically insulating sheets, in accordance with the invention, may provide a wide variety of fold lines 121, which, in turn, provide a wide variety of fold areas in multiple planes, which may result in a wide variety of open areas 150 for complex bus geometries, enabling implementation in the electrical system 10. Such varieties are within the scope of the invention.

Referring now to FIGS. 20 and 21, in an alternative aspect for the electrically insulating sheets, instead of apertures 122 or holes for receiving clips (such as canoe clips), screws or other fasteners, or in addition to such apertures 122 or holes, the electrically insulating sheets may provide tabs 160 and/or opposing tab opening 170, which may be narrow slits in the electrically insulating sheet for receiving the tabs 160. Each tab 160 may include, for example, a first portion 162, extending longitudinally from the body of the electrically insulating sheet, and may include a second portion 164 extending from the first portion 162. The second portion 164 may be an arcing area that is wider than the first portion 162.

In operation, upon folding the electrically insulating sheet, a tab 160 may be aligned with an opposing tab opening 170. Accordingly, the first and second portions 162 and 164 of the tab 160 may pass through the opposing tab opening 170, with the second portion 164 causing the tab 160 to be positively retained by the opposing tab opening 170. As a result, the electrically insulating sheet may be securely held without the additional cost of clips, screws or other fasteners.

Certain terminology is used herein for purposes of reference only, and thus is not intended to be limiting. For example, terms such as "upper," "lower," "above," and "below" refer to directions in the drawings to which reference is made. Terms such as "front," "back." "rear," "bottom." "side," "left" and "right" describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second" and other such numerical terms referring to structures do not imply a sequence or order unless clearly indicated by the context.

When introducing elements or features of the present disclosure and the exemplary embodiments, the articles "a," "an," "the" and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

Various features of the invention are set forth in the following claims. It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention: The embodiments described herein explain the best modes known for practicing the invention and will enable others skilled in the art to utilize the invention. All of the publications described herein including patents and non-patent publications are hereby incorporated herein by reference in their entireties.

The present invention may be part of a "safety system" used to protect human life and limb in a field, construction or other environment. Nevertheless, the term "safety," "safely" or "safe" as used herein is not a representation that the present invention will make the environment safe or that other systems will produce unsafe operation. Safety in such systems depends on a wide variety of factors outside of the scope of the present invention including: design of the safety system, installation and maintenance of the components of the safety system, and the cooperation and training of individuals using the safety system. Although the present invention is intended to be highly reliable, all physical systems are susceptible to failure and provision must be made for such failure.

What is claimed is:

1. A system for isolating power conductors comprising:
    a bus support;
    first and second power conductors disposed proximal to one another along the bus support, the first and second power conductors providing electrical power phases differing from one another; and
    a substantially flat, electrically insulating sheet having at least one fold line, the at least one fold line allowing the sheet to fold over at least one of the first and second power conductors in at least two directions,
    wherein the electrically insulating sheet electrically isolates a portion of the first power conductor from the second power conductor.

2. The system of claim 1, wherein the electrically insulating sheet is a polypropylene sheet.

3. The system of claim 1, wherein the electrically insulating sheet is folded completely around the at least one of the first and second power conductors.

4. The system of claim 3, wherein the electrically insulating sheet includes an open area allowing the at least one of the first and second power conductors to enter the electrically insulating sheet, and the electrically insulating sheet further includes a folded area opposing the open area.

5. The system of claim 3, wherein the electrically insulating sheet includes first and second open areas on opposing sides allowing the at least one of the first and second power conductors to pass through the electrically insulating sheet.

6. The system of claim 1, wherein the electrically insulating sheet further includes a first aperture for receiving a fastener.

7. The system of claim 6, further comprising a fastener, wherein the electrically insulating sheet further includes a second aperture for receiving a fastener, wherein the electrically insulating sheet is folded around the at least one of the first and second power conductors to allow the fastener to pass through the first and second apertures.

8. The system of claim 1, wherein the electrically insulating sheet further includes a tab and a tab opening, wherein the electrically insulating sheet is folded around the at least one of the first and second power conductors to allow the tab to pass through the tab opening.

9. An electrical system comprising:
    a plurality of compartments, each compartment being configured to receive a unit having an electrical component;
    a plurality of vertical bus conductors providing electrical power phases differing from one another;
    a plurality of horizontal bus conductors in communication with the plurality of vertical bus conductors;
    an electrically insulating bus support having a plurality of vertical channels configured to receive the vertical bus conductors, wherein the vertical bus conductors and the horizontal bus conductors are disposed on opposing sides of the electrically insulating bus support; and
    a substantially flat, electrically insulating sheet having at least one fold line, the at least one fold line allowing the sheet to fold over a bus conductor in at least two directions,
    wherein the electrically insulating sheet is folded over a horizontal bus conductor to electrically isolate a portion of the horizontal bus conductor from another horizontal bus conductor.

10. The electrical system of claim 9, wherein the electrically insulating sheet is a polypropylene sheet.

11. The electrical system of claim 9, wherein the electrically insulating sheet is folded completely around the horizontal bus conductor.

12. The electrical system of claim 11, wherein the electrically insulating sheet includes an open area allowing the horizontal bus conductors to enter the electrically insulating sheet, and the electrically insulating sheet further includes a folded area opposing the open area.

13. The electrical system of claim 11, wherein the electrically insulating sheet includes first and second open areas on opposing sides allowing the horizontal bus conductor to pass through the electrically insulating sheet.

14. The electrical system of claim 13, wherein the plurality of horizontal bus conductors is a first plurality of horizontal bus conductors, and further comprising a second plurality of horizontal bus conductors, wherein horizontal bus conductors of the first plurality of horizontal bus conductors are electrically connected to respective horizontal bus conductors of the second plurality horizontal bus conductors at a plurality of splice areas, and wherein the electrically insulating sheet is folded completely around a splice area.

15. The electrical system of claim 9, further comprising a second electrically insulating sheet and a plurality of power bus risers, wherein power bus risers of the plurality power bus risers are electrically connected to respective horizontal bus conductors, and wherein the second electrically insulating sheet is folded over a power bus riser.

16. The electrical system of claim 9, further comprising a second electrically insulating sheet and a plurality of incoming lug pads, wherein incoming lug pads of the plurality incoming lug pads are electrically connected to respective conductors of at least one of the vertical bus conductors and the horizontal bus conductors, and wherein the second electrically insulating sheet is folded completely around an incoming lug pad.

17. The electrical system of claim 9, wherein the electrically insulating sheet further includes a first aperture for receiving a fastener.

18. The electrical system of claim 17, further comprising a fastener, wherein the electrically insulating sheet further includes a second aperture for receiving a fastener, wherein the electrically insulating sheet is folded around the horizontal bus conductor to allow the fastener to pass through the first and second apertures.

19. The electrical system of claim 9, wherein the electrically insulating sheet further includes a tab and a tab opening, wherein the electrically insulating sheet is folded around the horizontal bus conductor to allow the tab to pass through the tab opening.

20. The electrical system of claim 9, wherein the electrical system is a Motor Control Center (MCC).

\* \* \* \* \*